(12) United States Patent
Su et al.

(10) Patent No.: US 7,094,689 B2
(45) Date of Patent: Aug. 22, 2006

(54) AIR GAP INTERCONNECT STRUCTURE AND METHOD THEREOF

(75) Inventors: Yi-Nien Su, Kaohsiung (TW); Jyu-Horng Shieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/894,024

(22) Filed: Jul. 20, 2004

(65) Prior Publication Data

US 2006/0019482 A1   Jan. 26, 2006

(51) Int. Cl.
*H01L 21/4763* (2006.01)

(52) U.S. Cl. .................. 438/639; 438/637; 438/619

(58) Field of Classification Search ............ 438/619, 438/637, 700, 639; 257/E23.151, E23.175
See application file for complete search history.

(56) References Cited

U.S. PATENT DOCUMENTS

| | | | |
|---|---|---|---|
| 5,324,683 A | 6/1994 | Fitch et al. | |
| 5,407,860 A | 4/1995 | Stoltz et al. | |
| 5,444,015 A | 8/1995 | Aitken et al. | |
| 2002/0140104 A1* | 10/2002 | Morrow et al. | 257/774 |

FOREIGN PATENT DOCUMENTS

TW         092115180         7/2004

* cited by examiner

*Primary Examiner*—George Fourson
*Assistant Examiner*—Julio J. Maldonado
(74) *Attorney, Agent, or Firm*—Birch, Stewart, Kolasch & Birch, LLP.

(57) ABSTRACT

Methods for fabricating interconnect structures implementing air gaps therein is provided. In one embodiment, a semiconductor substrate with a first barrier layer formed thereon is provided. A first dielectric layer is formed above the barrier layer. The first dielectric layer is thereafter patterned and etched to form a plurality of stakes having first openings therebetween, the plurality of stakes for providing mechanical supporting strength for the interconnect structure. A sacrificial layer is formed in the first openings and above the plurality of stakes. A hard mask layer is formed above the sacrificial layer. A light sensitive layer is formed over the hard mask layer and is thereafter patterned to define a pattern therein. The hard mask layer, the sacrificial layer, and the first barrier layer are etched according to the pattern in the light sensitive layer to form second openings. The second openings are filled with a conductive material to form metal lines. The sacrificial layer is thereafter removed to form air gaps. A second barrier layer is formed over the plurality of stakes and the metal lines, the second barrier layer thereby sealing the air gaps.

24 Claims, 3 Drawing Sheets

AIR GAP INTERCONNECT STRUCTURE AND METHOD THEREOF

BACKGROUND

The present invention relates generally to the fabrication of semiconductor devices, and more particularly to methods and structures that implement air gaps in semiconductor devices.

As device dimensions continue to shrink, a reduction in interconnect linewidths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the ULSI technology. For this reason, prior art attempts to reduce the RC delays have focused on utilizing material with a low-k to fill the gaps between the metal lines. Silicon dioxide (SiO2) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated SiO2, aerogels, and polymers. Another method being proposed to lower the dielectric constant even further is to form air gaps between the interconnect lines. While silicon dioxide has a dielectric constant of about 4 and greater, the dielectric constant of air is about 1.

The formation of air gaps between conducting lines of high speed integrated circuits (IC's) is typically a combination of the deposition of a porous dielectric layer, selective etching of the dielectric layer, the deposition of a metal layer, and the removal of the dielectric layer to form the desired air gaps.

U.S. Pat. No. 5,407,860 (Stoltz et al.) discloses an air gap process by etching low-k material out between metal lines and forming a dielectric layer thereover.

U.S. Pat. No. 5,444,015 (Aitken et al.) shows a method for forming air gap between metal lines by removing the dielectric material between the lines.

U.S. Pat. No. 5,324,683 (Fitch et al.) shows a method for forming an air gap between metal lines by forming a dielectric layer between metal lines, forming an etch barrier layer(s) thereover and opening a hole in the etch barrier layer and isotropically etching the dielectric layer for form air gaps.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. To illustrate, FIG. 1 depicts a cross sectional view of a portion of an interconnect structure having air gaps formed therein according to a conventional method of interconnect formation. A semiconductor substrate 10 has a patterned barrier layer 20 formed thereon. A plurality of metal lines 80 are interposed between portions of the barrier layer 20 with air gaps 90 formed therebetween. A barrier layer 100 seals the upper surfaces of the plurality of metal lines 80 and air gaps 90. A dielectric layer 120 is subsequently formed above the barrier layer 100. While a portion of dielectric layer 120 overlying barrier layer 100 may not suffer from an overlay or dishing problem, portions of dielectric layer 120 overlay into a region 130 otherwise reserved for an air gap due to the insufficient support from underneath barrier layer 100. This overlay problem is particularly notorious in areas of the interconnect structure where metal lines are few and far between or where the distance between successive metal lines is wide. This overlay problem can cause many reliability problems. One such problem is distortion on the surface of the dielectric layer, which would require a planarization process to cure the distortion defect.

Accordingly, what is needed in the art is an air gap interconnect structure and method of manufacture thereof that addresses the above-discussed issues.

SUMMARY

The present invention is directed to methods for fabricating interconnect structures implementing air gaps therein. In one embodiment, a semiconductor substrate with a first barrier layer formed thereon is provided. A first dielectric layer is formed above the barrier layer. The first dielectric layer is thereafter patterned and etched to form a plurality of stakes having first openings therebetween, the plurality of stakes for providing mechanical supporting strength for the interconnect structure. A sacrificial layer is formed in the first openings and above the plurality of stakes. A hard mask layer is formed above the sacrificial layer. A light sensitive layer is formed over the hard mask layer and is thereafter patterned to define a pattern therein. The hard mask layer, the sacrificial layer, and the first barrier layer are etched according to the pattern in the light sensitive layer to form second openings. The second openings are filled with a conductive material to form metal lines. The sacrificial layer is thereafter removed to form air gaps. A second barrier layer is formed over the plurality of stakes and the metal lines, the second barrier layer thereby sealing the air gaps.

In another embodiment, an interconnect structure implementing air gaps is provided. The interconnect structure comprises a semiconductor substrate having a patterned barrier layer formed thereon. A plurality of metal lines is interposed between portions of the patterned barrier layer. A plurality of dielectric dummy stakes is interspersed between the plurality of metal lines for providing mechanical supporting strength for the interconnect structure. Air gaps are formed between any one area of the plurality of dummy stakes and the plurality of metal lines. A barrier layer thereafter seals upper surfaces of the plurality of dummy stakes, the plurality of metal lines, and the air gaps.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which.

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been shown in detail to avoid unnecessarily obscuring the present invention. Reference will now be made in detail to the present preferred embodiments of the present invention, examples of which are illustrated in the accompanying drawings.

FIGS. 2 through 8 illustrate schematic cross-sectional views of a formation of an interconnect structure incorporated with air gaps, by way of example, but not by way of limitation, according to one embodiment of the present invention. In the following description and the claims, the term air gap means an air dielectric, a gas dielectric, a gas gap, or any gas-phase dielectric.

Figure 2:
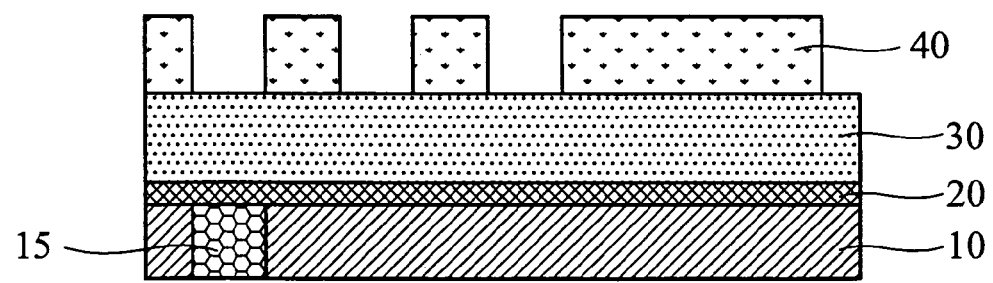
FIG. 2 is a schematic cross-sectional view of a formation of an interconnect structure showing a semiconductor substrate with a first barrier layer formed thereon; a first dielectric layer formed above the first barrier layer; and a patterned photoresist layer formed above the first dielectric layer according to one embodiment of the present invention.

FIG. 2 is a schematic cross-sectional view of a formation of an interconnect structure showing a semiconductor substrate with a first barrier layer formed thereon; a first dielectric layer formed above the first barrier layer; and a patterned photoresist layer formed above the first dielectric layer according to one embodiment of the present invention. A substrate 10 may include active and passive devices formed therein and conductive layers, and dielectric layers (e.g. interlayer dielectric (ILD)) formed thereabove, all of which are not shown. In one embodiment, a via or contact 15 is shown formed in substrate 10, the via or contact 15 will be in contact with a subsequently formed metal line. It is understood that vias or contacts 15 as shown in FIG. 2 are merely examples and that the numbers and patterns are dependent on circuit design considerations. Substrate 10 is any suitable substrate for device fabrication and it is understood that various semiconductor materials such as silicon, germanium, silicon germanium, silicon carbide, gallium arsenide, and indium phosphide and future-developed semiconductor materials may be used for substrate 10. A first barrier layer 20 is deposited by conventional deposition processes on substrate 10 and may serve both as an etch stop layer as well as a diffusion barrier for metal lines, which are typically made of copper. First barrier layer 20 may include materials such as, for example SiC, SiN, SiOC and SiON and may have a thickness of from about 300 to 600 angstroms. A first dielectric layer 30 is formed over first barrier layer 20, by for example, chemical vapor deposition (CVD). First dielectric layer 30 may comprise any suitable electrically insulative material such as, for example, oxides, FSG, and low-k materials having a dielectric constant of less than or equal to 3.0. First dielectric layer 30 may also be planarized following deposition using a chemical mechanical planarization (CMP) technique, or any other suitable technique suitable to provide a substantially planar top surface. Once planarized, a photoresist layer 40 is deposited, for example by spin coating technique, on first dielectric layer 30 and thereafter patterned and developed using conventional or future-developed photolithographic techniques for defining a plurality of dielectric stakes in a subsequent etching process.

Figure 3:
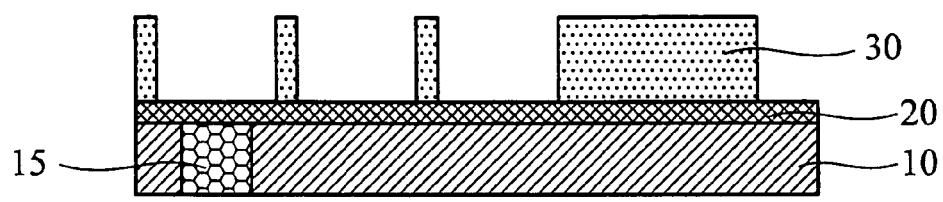
FIG. 3 is a schematic cross-sectional view of the structure of FIG. 2 showing the patterning and etching of the first dielectric layer to form a plurality of stakes having first openings therebetween, the plurality of stakes for providing mechanical supporting strength for the interconnect structure according to one embodiment of the present invention.

FIG. 3 is a schematic cross-sectional view of the structure of FIG. 2 showing the patterning and etching of the first dielectric layer to form a plurality of stakes having first openings therebetween, the plurality of stakes for providing mechanical supporting strength for the interconnect structure according to one embodiment of the present invention. First dielectric layer 30 is etched according to the pattern in photoresist layer 40 by conventional etching processes such as dry etch to form a plurality of dielectric stakes 30 with openings therebetween. In FIG. 3, these openings expose the first barrier layer 20. As shown in FIG. 3, the etch profile of first dielectric layer 30 is isotropic. However, it is understood that the etch profile could also be anisotropic and consequently, the etch profile depends on the circuit design criteria being employed. The plurality of dielectric stakes 30 provide mechanical supporting strength for the interconnect structure and in one embodiment, each of the plurality of dielectric stakes 30 has a width of less than about 0.2 µm.

Patterned photoresist layer 40 is thereafter stripped away resulting in the interconnect structure shown in FIG. 3.

Figure 4:
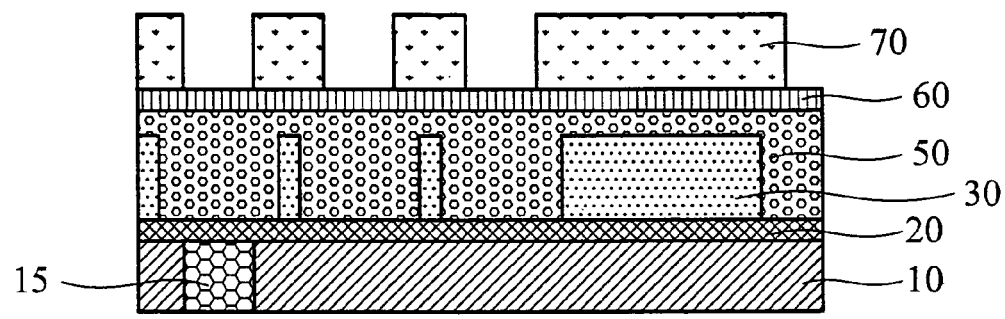
FIG. 4 is a schematic cross-sectional view of the structure of FIG. 3 showing the formation of a sacrificial layer in the first openings and above the plurality of stakes; a hard mask layer formed above the sacrificial layer; and a patterned photoresist layer formed above the hard mask layer according to one embodiment of the present invention.

FIG. 4 is a schematic cross-sectional view of the structure of FIG. 3 showing the formation of a sacrificial layer in the first openings and above the plurality of stakes; a hard mask layer formed above the sacrificial layer; and a patterned photoresist layer formed above the hard mask layer according to one embodiment of the present invention. A sacrificial layer 50 may be deposited in the openings and above the plurality of dielectric stakes 30 by, for example spin coating techniques and future-developed deposition techniques. In general, sacrificial layer 30 includes a material which can be reacted away without removing other structures. Further, the sacrificial material preferably has substantial thermal stability. Thermal stability here refers to the ability to sustain the temperature range in the fabrication process. Sacrificial layer 50 preferably includes, for example, high thermally stable photoresist, SILK, porous SILK, benzocyclobutene, FLARE, Nautilus, Teflon, or any other material that substantially serves the same function of sacrificial layer 50. A portion of the space occupied by sacrificial layer 50 is the space to be formed into air gaps as is to be described later. A hard mask layer 60 may be optionally formed over sacrificial layer 30 by conventional methods. In one embodiment, hard mask layer 60 has a thickness of between about 300 to about 1,500 angstroms. Hard mask layer 60 assists in improving photolithography patterning precision and/or acts as a barrier layer to protect sacrificial layer 50 from subsequent processing. A patterned photoresist layer 70 is then formed over hard mask layer 60 by conventional or future-developed photolithographic techniques as discussed above with reference to FIG. 2 resulting in the interconnect structure shown in FIG. 4.

Figure 5:
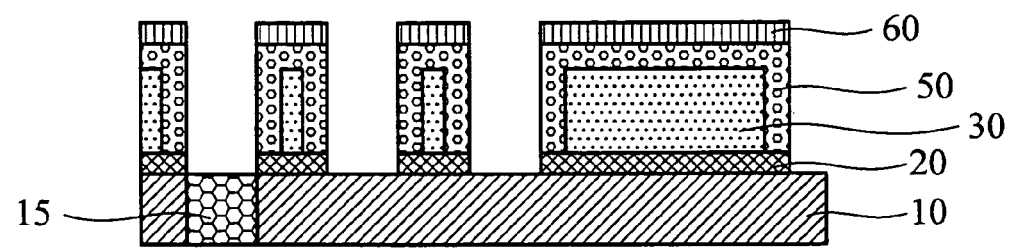
FIG. 5 is a schematic cross-sectional view of the structure of FIG. 4 showing etching of the hard mask layer, the sacrificial layer, and the first barrier layer according to the patterned photoresist layer to form second openings according to one embodiment of the present invention.

FIG. 5 is a schematic cross-sectional view of the structure of FIG. 4 showing etching of the hard mask layer, the sacrificial layer, and the first barrier layer according to the patterned photoresist layer to form second openings according to one embodiment of the present invention. The etching may be carried out by a dry etch procedure to form the second openings where a conductive material will later be deposited thereover. After the step of etching, in one embodiment, sacrificial layer 50 envelops each of the plurality of dielectric stakes 30. In another embodiment, sacrificial layer 50 envelops a portion of the plurality of dielectric stakes 30. Patterned photoresist layer 70 is then stripped away resulting in the interconnect structure shown in FIG. 5.

Figure 6:
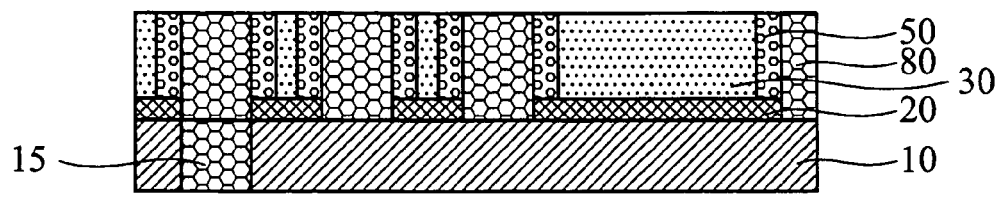
FIG. 6 is a schematic cross-sectional view of the structure of FIG. 5 showing filling the second openings with a conductive material to form metal lines and planarization of the interconnect structure according to one embodiment of the present invention.

FIG. 6 is a schematic cross-sectional view of the structure of FIG. 5 showing filling the second openings with a conductive material to form metal lines and planarization of the interconnect structure according to one embodiment of the present invention. A conductive material 80 fills the second openings by conventional metal deposition processes. Conductive material 80 comprises a conductive material, such as, for example, copper, copper alloy, tungsten, aluminum, aluminum alloy, polysilicon, titanium, gold, tin, lead, metal, and metal alloy. The interconnect structure is thereafter planarized (such as by a CMP process) to form metal lines 80. In one embodiment of the present invention, metal lines 80 is planarized to a height of from about 1,000 angstroms to about 10,000 angstroms. In another embodiment, metal lines 80, hard mask layer 60, and sacrificial layer 50 are planarized to expose top surfaces of the plurality of dielectric stakes 30. In one embodiment, the ratio of the width of one of the metal lines 80 to the spacing between any two metal lines is substantially about 1:1.

Figure 7:
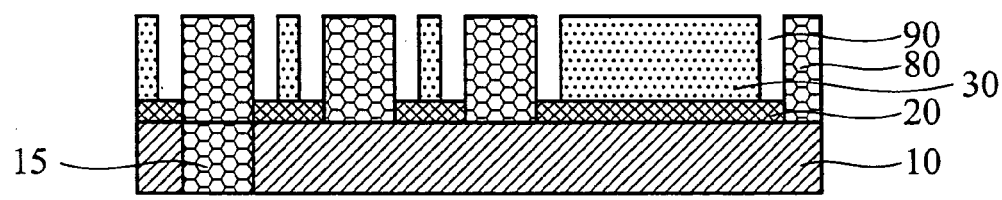
FIG. 7 is a schematic cross-sectional view of the structure of FIG. 6 showing the removal of the sacrificial layer to form air gaps according to one embodiment of the present invention.

FIG. 7 is a schematic cross-sectional view of the structure of FIG. 6 showing the removal of the sacrificial layer to form air gaps according to one embodiment of the present invention. Sacrificial layer 50 is removed from areas between one of the plurality of dielectric stakes 30 and one of metal lines 80. Sacrificial layer 50 may be removed by either conventional etching or stripping procedures such as by, for example, dry plasma stripping using gases such as O2, N2, H2, and Ar. Preferably, sacrificial layer 50 will have high etch selectivity as compared with first barrier layer 20, the plurality of dielectric stakes 30, and metal lines 80. After stripping, the space originally occupied by sacrificial layer 50 is now air gap 90. Air gap 90 will therefore enable the performance of metal lines 80 to increase to higher speeds due to the reduced intra-level capacitance. While FIG. 7 illustrates that the entire sacrificial layer 50 is stripped away and thus removed between metal lines 80 and dielectric stakes 30, it is understood by those skilled in the art that a portion of sacrificial layer 50 may be removed to produce a somewhat smaller air gap 90 which would still be effective in reducing the intra-level capacitance in accordance with the principles of the present invention. Those skilled in the art will also recognize that there are myriad interconnect structures and interconnect schemes in which an embodiment of a stake layout scheme incorporating air gaps of the present disclosure may be implemented and it is understood that many of the interconnection schemes are dictated by design rules.

Figure 8:
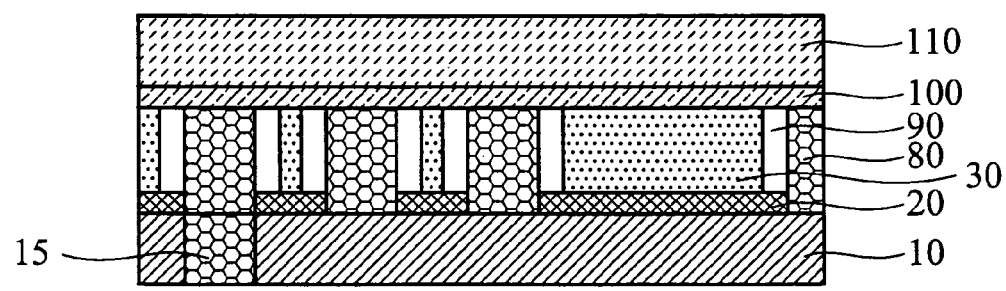
FIG. 8 is a schematic cross-sectional view of the structure of FIG. 7 showing the formation of a second barrier layer over the plurality of stakes and the metal lines, the second barrier layer sealing the air gaps, and the formation of a second dielectric layer over the second barrier layer according to one embodiment of the present invention.

FIG. 8 is a schematic cross-sectional view of the structure of FIG. 7 showing the formation of a second barrier layer over the plurality of stakes and the metal lines, the second barrier layer sealing the air gaps, and the formation of a second dielectric layer over the second barrier layer according to one embodiment of the present invention. Air gaps 90 are sealed for example, by depositing a second barrier layer 100 over the plurality of stakes 30 and metal lines 80. Second barrier layer 100 is deposited by conventional deposition processes and may serve both as an etch stop layer as well as a diffusion barrier for metal lines. Second barrier layer 20 may include materials such as, for example SiC, SiN, SiOC and SiON and may have a thickness of from about 300 to 600 angstroms. Air gaps 90 are thus sealed between metal lines 80, dielectric stakes 30, first barrier layer 20 and second barrier layer 100. Prior to sealing, moisture may be driven out of the area of air gaps 90 by heating the interconnect structure. The air (or more generally ambient gas) within air gaps 90 is typically of low pressure and may be on the order of 100 militorr.

A second dielectric layer 110 may optionally be formed over second barrier layer 100, by for example, chemical vapor deposition (CVD). Second dielectric layer 110 may comprise any suitable electrically insulative material such as, for example, oxides, FSG, and low-k materials having a dielectric constant of less than or equal to 3.0. Second dielectric layer 110 may also be planarized using a CMP technique, or any other suitable technique suitable to provide a substantially planer top surface.

Figure 1:
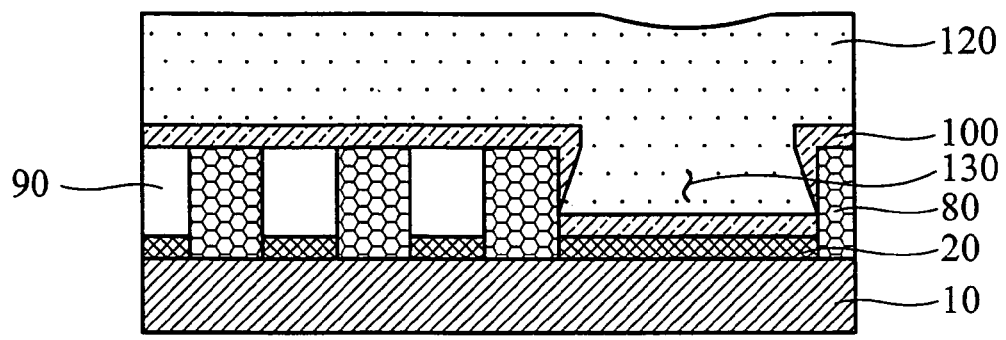
FIG. 1 is a cross sectional view of a portion of an interconnect structure having air gaps formed therein according to a conventional method of interconnect formation.

It is understood that the entire process of creating interconnect structures incorporating air gaps may be repeated to form a multi-layer metallization structure in accordance to the objectives of the present invention. Those skilled in the art will recognize that there are myriad applications, structures, and interconnection schemes in which an embodiment of an interconnect structure incorporating air gaps of the present disclosure may be implemented. Accordingly, for the purpose of clarity and brevity, additional details of other interconnection schemes are not illustrated or further described herein The present invention offers several advantages over conventional methods of forming interconnect structures employing air gaps. By preventing dishing, which was evident in the interconnect structure of FIG. 1, there is no need to use a separate CMP planarization step to cure distortion problems that may be evident in later formed layers. Also, the present invention offers better mechanical stability as the plurality of dielectric stakes provide mechanical supporting strength for the interconnect structure, especially in areas of the interconnect structure where the distance between successive metal lines is wide.

It is apparent that the embodiments of the present invention may be applicable to damascene processes wherein air gaps are created to reduce intra-level capacitance. For purposes of defining the invention, a damascene process is intended to include dual damascene (and higher iterations) processes. It is further understood that while the term air gap is used herein, the chemical constituents of the air gap will be dictated by the ambient atmosphere associated with the particular type of sealing process used. Typically reduced pressure will be associated with such sealing processes.

The present invention has been described relative to a preferred embodiment. Improvements or modifications that, become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, a description of a technology in the "BACKGROUND" is not to be construed as an admission that technology is prior art to any invention(s) in this disclosure. Neither is the "SUMMARY" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for forming an interconnect structure, comprising the steps of:
   providing a semiconductor substrate with a first barrier layer formed thereon;
   forming a first dielectric layer above the first baffler layer;
   patterning and etching the first dielectric layer to form a plurality of stakes having first openings therebetween, the plurality of stakes for providing mechanical supporting strength for the interconnect structure, the first openings exposing a portion of the first baffler layer;
   forming a sacrificial layer in the first openings and above the plurality of stakes;
   forming a hard mask layer above the sacrificial layer;
   forming a light sensitive layer over the hard mask layer;
   patterning the light sensitive layer to define a pattern therein;
   etching the hard mask layer, the sacrificial layer, and the first baffler layer according to the pattern in the light sensitive layer to form second openings;
   filling the second openings with a conductive material to form metal lines; and
   removing the sacrificial layer to form air gaps.

2. The method of claim 1, wherein the first baffler layer comprises an etch stop layer, wherein the etch stop layer comprises a material selected from the group consisting of SiC, SiN, SiOC, SiON, and combinations thereof, and further wherein the etch stop layer has a thickness of from about 300 to 600 angstroms.

3. The method of claim 1, wherein the first dielectric layer comprises a material selected from the group consisting of oxide, FSG, and low-k materials having a k less than or equal to 3.0.

4. The method of claim 1, wherein the substrate compnses a patterned single damascene vias or contacts in contact with the metal lines.

5. The method of claim 1, wherein each of the plurality of stakes has a width of less than about 0.2 µm.

6. The method of claim 1, wherein the sacrificial layer comprises a material selected from the group consisting of high thermally stable photoresist, SiLK, porous SiLK, benzocyclobutene, FLARE, Nautilus, Teflon, and combinations thereof, and the sacrificial layer is formed by a spin coating process.

7. The method of claim 1, wherein the hard mask layer has a thickness of between about 300 to about 1,500 angstroms.

8. The method of claim 7, wherein the hard mask layer is SiC, SiN, SiOC, or SiON.

9. The method of claim 1, further comprising the step of:
   stripping the light sensitive layer after the step of etching the hard mask layer, the sacrificial layer, and the first barrier layer.

10. The method of claim 1, wherein the conductive material is a material selected from the group consisting of copper, copper alloy, tungsten, aluminum, polysilicon, metal, metal alloy, and combinations thereof.

11. The method of claim 1, wherein prior to removing the sacrificial layer, further comprising the step of:
    planarizing the metal lines to a predetermined height.

12. The method of claim 1, wherein prior to removing the sacrificial layer, further comprising the step of:
    planarizing the metal lines, the hard mask layer, and the sacrificial layer to expose top surfaces of the plurality of dielectric stakes.

13. The method of claim 1, wherein the removing the sacrificial layer to form air gaps includes removing the sacrificial layer from areas between the plurality of dielectric stakes and the metal lines.

14. The method of claim 1, wherein the ratio of the width of one of the metal lines to the spacing between any two metal lines is substantially about 1:1.

15. The method of claim 1, further comprising the step of:
    forming a second barrier layer over the plurality of stakes and the metal lines, the second barrier layer thereby sealing the air gaps.

16. The method of claim 15, further comprising the step of:

forming a second dielectric layer over the second barrier layer.

17. A method for forming air gaps between metal lines of a semiconductor device, comprising the steps of:
provided a semiconductor substrate with a first barrier layer formed thereon;
forming a first dielectric layer above the first barrier layer;
patterning and etching the first dielectric layer to form a plurality of stakes having first openings therebetween, the plurality of stakes for providing mechanical supporting strength for the semiconductor device, the first openings exposing a portion of the first barrier layer;
forming a sacrificial layer in the first openings and above the plurality of stakes;
forming a hard mask layer above the sacrificial layer;
forming a light sensitive layer over the hard mask layer;
patterning the light sensitive layer to define a pattern therein;
etching the hard mask layer, the sacrificial layer, and the first barrier layer according to the pattern in the light sensitive layer to form second openings;
filling the second openings with a conductive material to form metal lines; and
removing the sacrificial layer to form air gaps.

18. The method of claim 17, wherein the substrate comprises a patterned single damascene vias or contacts in contact with the metal lines.

19. The method of claim 17, further comprising the step of:
stripping the light sensitive layer after the step of etching the hard mask layer, the sacrificial layer, and the first baffler layer.

20. The method of claim 17, wherein prior to removing the sacrificial layer, further comprising the step of:
planarizing the metal lines to a predetermined height.

21. The method of claim 17, wherein prior to removing the sacrificial layer, further comprising the step of:
planarizing the metal lines, the hard mask layer, and the sacrificial layer to expose top surfaces of the plurality of dielectric stakes.

22. The method of claim 17, wherein the removing the sacrificial layer to form air gaps includes removing the sacrificial layer from areas between the plurality of dielectric stakes and the metal lines.

23. The method of claim 17, further comprising the step of:
forming a second barrier layer over the plurality of stakes and the metal lines, the second barrier layer thereby sealing the air gaps.

24. The method of claim 23, further comprising the step of:
forming a second dielectric layer over the second barrier layer.

* * * * *